United States Patent [19]
Greason

[11] Patent Number: 5,898,610
[45] Date of Patent: *Apr. 27, 1999

[54] METHOD AND APPARATUS FOR BIT CELL GROUND CHOKING FOR IMPROVED MEMORY WRITE MARGIN

[75] Inventor: Jeffrey K. Greason, Portland, Oreg.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/775,796

[22] Filed: Dec. 31, 1996

[51] Int. Cl.⁶ .................................................. G11C 11/00
[52] U.S. Cl. ........................................ 365/154; 365/156
[58] Field of Search ....................................... 365/156, 154

[56] References Cited

U.S. PATENT DOCUMENTS

| | | | |
|---|---|---|---|
| Re. 33,694 | 9/1991 | McElroy | 365/154 |
| 5,301,146 | 4/1994 | Hama | 365/154 |

OTHER PUBLICATIONS

"1996 Symposium on VLSI Circuits," Digest of Technical Papers, IEEE, Honolulu, Jun. 13–15, 1996, pp. iii–xxvii and 126–127.

IEEE Solid State Circuits Coucis, 1996 Symposium on VLSI Circuits, Digest of Technical Papers, Honolulu, Jun. 13–15, 1996, pp. iii–xxviii and pp. 126–127.

*Primary Examiner*—David Nelms
*Assistant Examiner*—M. Tran
*Attorney, Agent, or Firm*—Blakely, Sokoloff, Taylor & Zafman LLP

[57] ABSTRACT

A method and apparatus to increase the size of the design window for write margin and read stability margin of memory cells without requiring a voltage above the power supply voltage or below ground. An SRAM consisting of an SRAM cell having a ground reference and a circuit coupled to receive a first signal and coupled to drive the ground reference. The circuit is configured to drive the ground reference to a first voltage if the first signal is in a first state. The circuit is configured such that the first node is at a second voltage if the first signal in a second state, the first signal being in the first state indicating a write operation, the first signal being in the second state indicating a non-write operation, the first voltage being greater than the second voltage.

23 Claims, 6 Drawing Sheets

METHOD AND APPARATUS FOR BIT CELL GROUND CHOKING FOR IMPROVED MEMORY WRITE MARGIN

BACKGROUND OF THE INVENTION

1. Field of the Invention

The present invention relates to the field of memory devices; more particularly, the present invention relates to a method and apparatus for performing bit cell ground choking to improve static random access memory (SRAM) write margin.

2. Description of Related Art

Static random access memory (SRAM) cells are designed to reliably retain their value during a read operation by having an acceptable read stability margin and to reliably modify their value during a write operation by having acceptable write margin.

FIG. 1 illustrates read stability margin in a prior art SRAM cell. An SRAM cell has a bit (B) node and bit bar (B#) node. Whether the value of the bit stored is a logic 1 or a logic 0, one of these nodes will be storing a logic 0. Read stability is typically more critical on the node that stores a logic 0. The following illustration is the case where the bit stored is a logic 0. In that case, the bit node is a logic 0 and the bit bar node is a logic 1. However, similar analysis applies to the bit bar node when the bit stored is a logic 1.

During a read operation, the bit line (BL) column and bit line bar (BL#) column are initialized to a logic 1. The word line (WL) bus is asserted to turn on a transfer gate (transistor $T_x$) such that the BL column begins to be discharged through a first pull down device (transistor $T_{pd}$). While the BL column is being discharged, the voltage at the bit node is determined by the ratio of the resistance of transistor $T_x$ and the resistance of transistor $T_{pd}$. The bit node is also the input to the second pull down device (transistor $T_{trip}$) which begins to turn on at a voltage $V_{trip}$. If the voltage at the bit node exceeds $V_{trip}$, the voltage at the bit bar node is pulled down thereby corrupting the data within the SRAM cell by flipping the value of the bit stored.

In order to improve read stability margin, the voltage at the node storing the logic 0 should be reduced and/or the $V_{trip}$ voltage should be increased. In order to lower the voltage of the bit node, the resistance of transistor $T_{pd}$ should be made small with respect to the resistance of transistor $T_x$. In order to increase the $V_{trip}$ voltage, the resistance of a transistor $T_p$ should be made small with respect to the resistance of transistor $T_{trip}$.

FIG. 2 illustrates write margin in a prior art SRAM cell. Write margin, unlike read stability margin, is typically more critical on the node that stores a logic 1. The following illustration is the case where the bit stored is a logic 1 and a write logic 0 operation is being performed. In that case, the bit node is initially a logic 1 and the bit bar node is initially a logic 0. However, similar analysis applies to the bit bar node when the bit stored is a logic 0 and a write logic 1 operation is being performed.

During a write logic 0 operation, the bit line (BL) column is driven to a logic 0 and bit line bar (BL#) column is driven to a logic 1. The word line (WL) bus is asserted to turn on a transfer gate (transistor $T_x$) such that the voltage at the bit node is determined by the ratio of the resistance of transistor $T_x$ and the resistance a first pull up device (transistor $T_{pu}$). The bit node is also the input to the second pull down device (transistor $T_{trip}$) which turns off when the voltage of the bit node is below voltage $V_{trip}$. In order to successfully write the logic 0, the voltage at the bit bar node must be pulled down below voltage $V_{trip}$. This can be difficult because the non-linear resistance of transistor $T_x$ typically increases as the voltage drop across it decreases.

In order to improve write margin, the voltage at the node storing the logic 1 should be pulled lower and/or the $V_{trip}$ voltage should be higher. As in the case to improve read stability, the resistance of transistor $T_p$ should be made small with respect to the resistance transistor $T_{trip}$ in order to increase the $V_{trip}$ voltage. However, unlike the case to improve read stability, the resistance of transistor $T_p$ should be made large with respect to the resistance of transistor $T_x$ in order to lower the voltage drop across transistor $T_x$.

In order to improve speed, the resistance of transistors $T_{pd}$, $T_{trip}$, and $T_x$ should be minimized. If one assumes that the resistance of $T_x$ is minimized for speed, read stability considerations suggest reducing the resistance of transistors $T_{pd}$, $T_{pu}$, and $T_{trip}$, whereas write margin considerations suggest increasing the resistance of these transistors. Therefore, the designer must select these parameters within these competing constraints to have acceptable read stability and write margins.

The design window defined by these competing constraints is becoming smaller in each subsequent generation of process technology. Since manufacturing process variability tends to increase relative to the shrinking transistor feature sizes in each generation, it is becoming more difficult to design an SRAM cell that has acceptable margin within the shrinking design window. This problem is exacerbated because not only is there a tendency for the SRAM cell error rate to increase because of the shrinking design window, but the number of SRAM cells per device is increasing.

Power supply voltages are being reduced to reduce power consumption and avoid reliability problems as the transistor feature sizes shrink. The $V_{trip}$ voltage in a typical SRAM cell is being reduced to track the reduced power supply voltages. However, process variability associated with the $V_{trip}$ voltage variations do not scale with the $V_{trip}$ voltage. Therefore the relative variation of the $V_{trip}$ voltage tends to increase as the transistor feature sizes shrink.

In order to extend the design window, some designs have resorted to driving the word line above the power supply voltage during write operations and driving the word line to the power supply voltage during read operations. This has the effect of reducing the resistance of $T_x$ during write operations as compared with the resistance of $T_x$ during read operations. Therefore, the resistance of $T_x$ is controlled to improve margin for each of these operations thereby widening the design window.

Alternatively, some designs have driven one of the bit lines below ground during write operations. Referring to FIG. 2, the bit node is at a voltage between the power supply voltage and the bit line voltage as determined by the ratio of the resistance of transistor $T_{pu}$ and the resistance of transistor $T_x$ according to well-known methods. The voltage at the bit node will tend to decrease as the voltage at the bit line decreases. Since the voltage at the bit node is decreased relative to $V_{trip}$, write margin is improved without affecting the read margin parameters.

One problem with both these methods is that they require voltages to be driven either above the power supply voltage or below ground. Generating additional voltages adds complexity and cost to a design. In addition, application of voltages beyond the standard power supply range may lead to reliability problems.

What is needed is a method and apparatus to increase the size of the design window for SRAM cells without requiring a voltage above the power supply voltage or below ground.

SUMMARY OF THE INVENTION

A method and apparatus for providing an SRAM cell with improved write margin without requiring a voltage above the power supply voltage or below ground. An SRAM consisting of an SRAM cell having a ground reference and a circuit coupled to receive a first signal and coupled to drive the ground reference. The circuit is configured to drive the ground reference to a first voltage if the first signal is in a first state. The circuit is configured such that the first node is at a second voltage if the first signal in a second state. The first state indicates a write operation and the second state indicates a non-write operation. The first voltage is less than the second voltage.

DETAILED DESCRIPTION

The present invention is a method and apparatus to increase the size of the design window for static random access memory (SRAM) cells without requiring a voltage above the power supply voltage or below ground. The design window is defined by the competing considerations of write margin and read stability margin. The present invention employs a circuit which provides a local ground reference to an SRAM cell. Preferably, the circuit uses the current from the SRAM cell to provide a voltage on the local ground reference. Such a circuit uses less power and area than alternative circuits which may employ a device such as a charge pump or a voltage regulator to provide the voltage on the local ground reference.

During a write operation, the circuit provides a voltage on the local ground reference that is greater than a global ground reference. Raising the local ground reference voltage tends to increase write margin. During a read operation, the circuit provides a voltage on the local ground reference that approximates the global ground reference. By maintaining the local ground reference at the global ground reference, read stability margin tends to be maintained. Therefore, by controlling the voltage of the local ground reference according to the operation to be performed, the design window becomes larger. It will be apparent to one skilled in the art that the present invention is applicable to memory cells that provide internal feedback within the memory cell to maintain data and the present invention is not meant to be limited to a particular type of static memory cell design.

Figure 1:
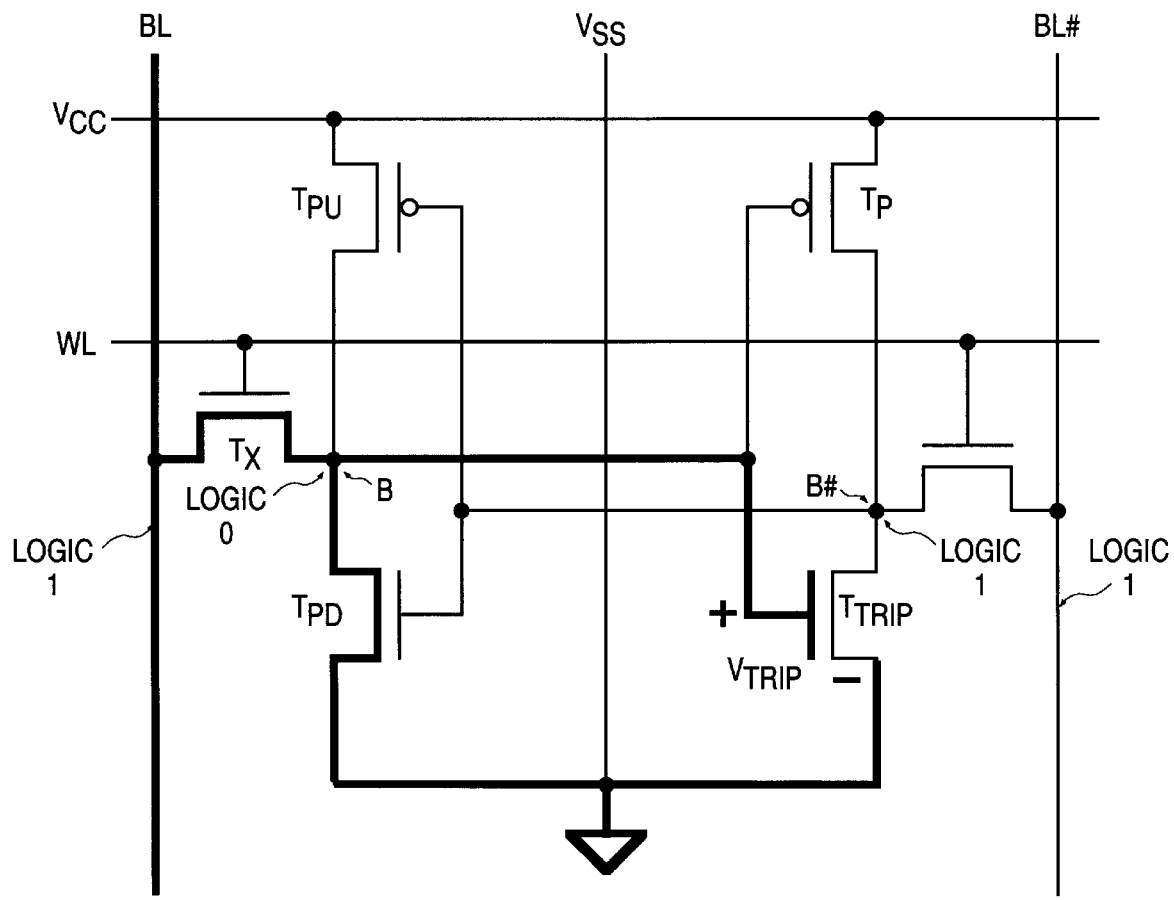
FIG. 1 illustrates a prior art SRAM cell performing a read operation.
Figure 2:
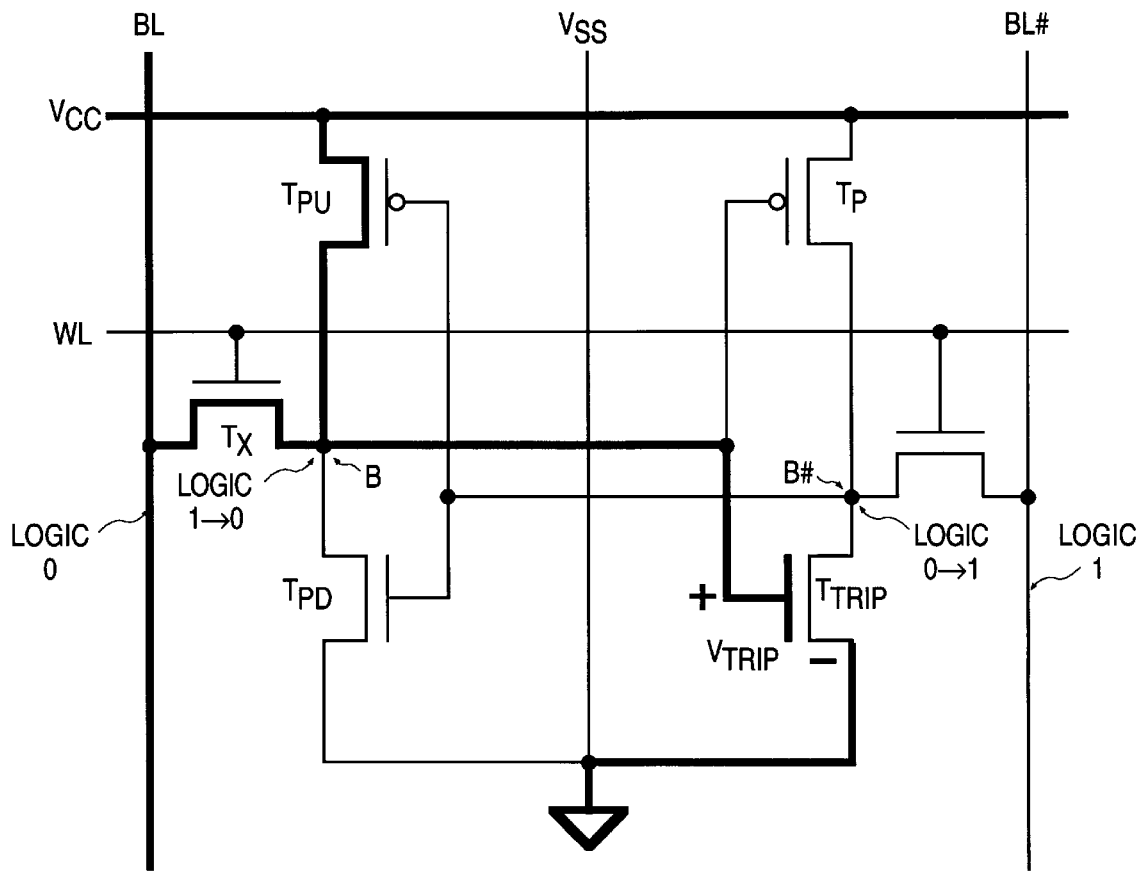
FIG. 2 illustrates a prior art SRAM cell performing a write operation.
Figure 3:
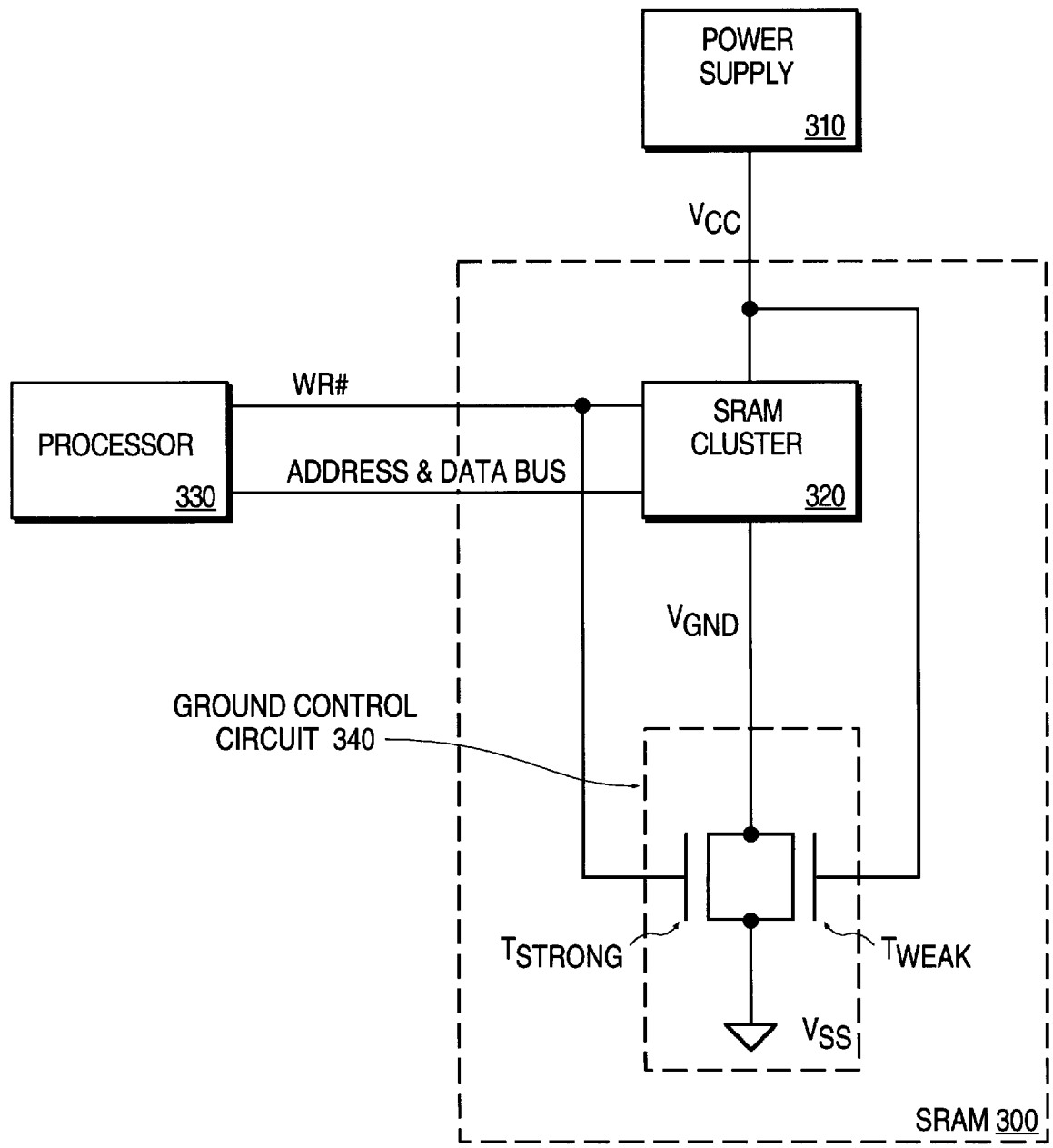
FIG. 3 illustrates one embodiment of a system of the present invention.

FIG. 3 illustrates one embodiment of a system of the present invention.

The system includes an SRAM 300 having an SRAM cluster 320 and a ground control circuit 340, a power supply 310, and a processor 330.

Preferably, the SRAM cluster 320 is a column of memory cells coupled together according to well known methods such that they share a common local ground reference ($V_{gnd}$). Alternatively, the SRAM cluster 320 may be multiple columns of memory cells that share a common local ground reference. In still another embodiment, the SRAM cluster 320 may be a single memory cell using a local ground reference.

The processor 330 drives a write signal (WR#) to the SRAM 500 to indicate whether a write operation is to be performed. In the present embodiment, the WR# signal is driven low to indicate a write operation and driven high to indicate a non-write operation such as a read operation or a maintain operation. The processor 330 also drives an address and data bus to the SRAM cluster 320 to indicate which memory cell to access and provide a path to transfer data to and from the selected memory cell. For purposes of simplifying the description herein, well-known circuitry to select an SRAM cell according to an address is not described here. In addition, well-known circuitry to route the data to the SRAM cell during a write operation and sense the data from the SRAM cell during a read operation is not described here. Multiple sets of memory clusters and corresponding ground control circuits may be used within the SRAM 300. Only one memory cell is selected from each memory cluster during a write, read, or retain operation such that the local ground reference for that cluster can be changed according to the operation to be performed on the selected cell within that cluster.

The SRAM cluster 320 is coupled to receive a power supply voltage from the power supply 310 and a local ground reference from the ground control circuit 340. Preferably, the ground control circuit 340 comprises a strong (low resistance) transistor ($T_{strong}$) having a gate coupled to the WR# signal and a weak (high resistance) transistor ($T_{weak}$) having a gate coupled to the power supply voltage. The drains of these transistors are connected to the local ground reference and the sources are connected to a global ground reference.

When a write operation is indicated on by the WR# signal, transistor $T_{strong}$ is disabled, leaving a high resistance path through transistor $T_{weak}$ from the local ground reference to the global ground reference. Therefore, the local ground reference is at a higher voltage than the local ground reference by the voltage drop across transistor $T_{weak}$ which is determined by the current from the active bit in the SRAM cluster 320 through the local ground reference resistance. In one embodiment, the current is approximately 60 microamps and the resistance of transistor $T_{weak}$ is approximately 3.3 kilohms. Thus, the local ground reference is 200 millivolts above the global ground reference during a write operation.

When a non-write operation is indicated on by the WR# signal (e.g., a read or sustain operation), transistor $T_{strong}$ is enabled, providing a low resistance path through transistor $T_{strong}$ from the local ground reference to the global ground reference. The voltage of the local ground reference approximates the voltage the local ground reference since the voltage drop across transistor $T_{strong}$ is relatively insignificant. In one embodiment, the resistance of transistor $T_{strong}$ is approximately 330 ohms. Thus, the local ground reference is approximately 20 millivolts above the global ground reference during a non-write operation.

It will be apparent to one skilled in the art that numerous other circuits that generate a local ground reference voltage dependent on the WR# signal may be used. For example, a control logic may be used to couple the local ground reference to the global ground reference during a non-write operation, and couple the local ground reference to a voltage regulator to provide a higher voltage during a write operation. Alternatively, a control logic may be used to couple the local ground reference to a first voltage regulator to provide a first voltage during a write operation, and couple the local ground reference to a second voltage regulator to provide a second voltage (which is lower than the first voltage) during a non-write operation. Other circuits may be used to provide the voltages under either the write operation or the non-write operation.

As is described above, $T_{strong}$ and $T_{weak}$ provide a variable resistance controlled to generate a variable local ground reference voltage. Alternatively, other circuits may be used to provide a variable resistance according to well-known methods. For example, a single transistor may be used to generate a variable resistance. In one configuration, this transistor is biased into a resistive region power ration by applying a voltage between the power supply voltage and the global ground reference voltage when the WR# signal is asserted. In one embodiment, this transistor would be fully turned off during a write operation. In this case, a small resistor in parallel may be used to bias the local ground reference or the local ground reference may be allowed to float for a period. If the local ground reference is allowed to float while the write operation is being performed, the write operation is performed relatively quickly so that the local ground reference stays in the desired range in order to avoid losing the written data. When the WR# signal is not asserted to indicate a non-write operation, this transistor would be biased to provide to provide a lower resistance than that provided during a write operation. In one embodiment, this transistor would be fully turned on during a non-write operation.

It will be apparent to one skilled in the art that the global ground reference does not necessarily have to be at a ground voltage. The global ground reference may be at voltages other than ground within design constraints such as read stability margin. Similarly, the local ground reference may be driven to numerous voltages greater than the global ground reference within design constraints such as write margin.

Figure 4:
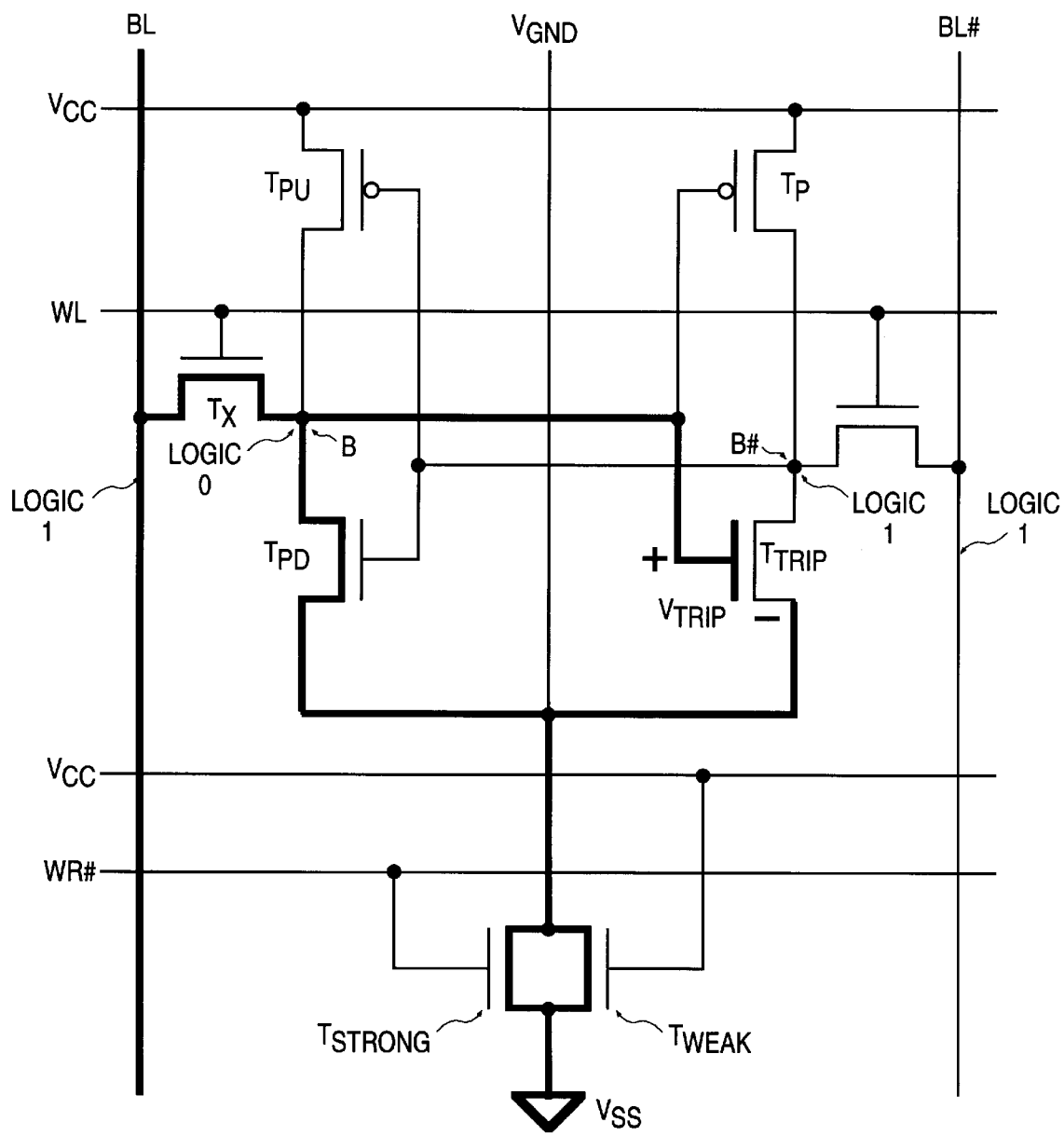
FIG. 4 illustrates one embodiment of an SRAM of the present invention performing a read operation.

FIG. 4 illustrates read stability margin in an SRAM cell of the present invention. The following illustration is the case where the bit stored is a logic 0. In that case, the bit node is a logic 0 and the bit bar node is a logic 1.

As in a prior art read operation, the bit line (BL) column and bit line bar (BL#) column are initialized to a logic 1 and the word line (WL) bus is asserted to turn on a transfer gate (transistor $T_x$) such that the BL column begins to be discharged through a first pull down device (transistor $T_{pd}$). The source of the transistor $T_{pd}$ is coupled to a ground node (local ground reference) which is driven to the $V_{ss}$ voltage (global ground reference) by enabling the strong (low resistance) transistor $T_{strong}$. This effectively provides a low resistance (and low voltage drop) path between the local ground reference and the global ground reference.

While the BL column is being discharged during the read operation, the voltage at the bit (B) node is determined by the ratio of the resistance of transistor $T_x$ and the resistance of transistor $T_{pd}$. Since the voltage of the local ground reference approximates the global ground reference, the read stability margin approximates that of a prior art SRAM cell.

Figure 5:
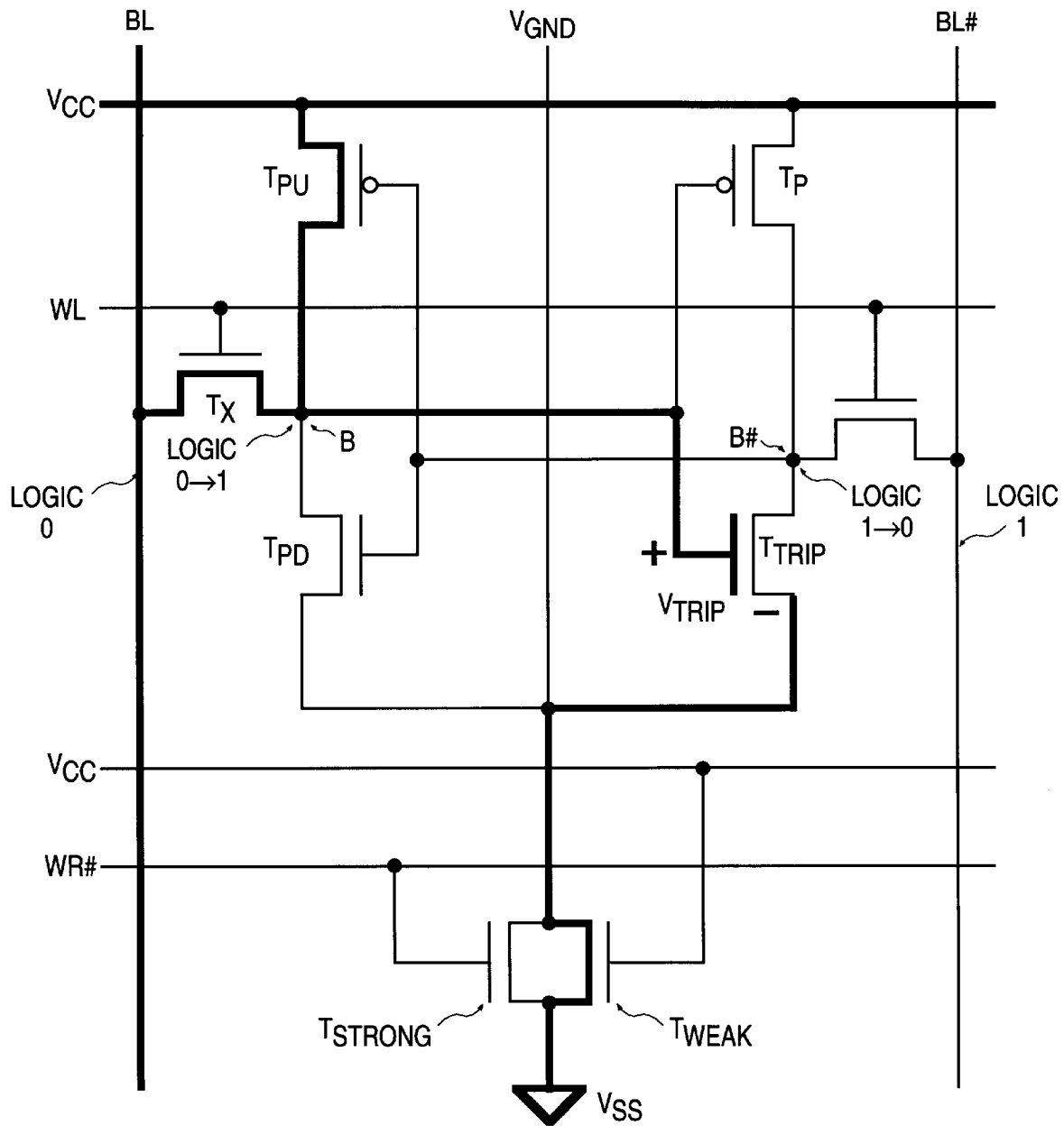
FIG. 5 illustrates one embodiment of an SRAM of the present invention performing a write operation.

FIG. 5 illustrates write margin in an SRAM cell of the present invention. The following illustration is the case where the bit stored is a logic 1 and a write logic 0 operation is being performed.

As in a prior art write logic 0 operation, the bit line (BL) column is driven to a logic 0, the bit line bar (BL#) column is driven to a logic 1, and the word line (WL) bus is asserted to turn on a transfer gate (transistor $T_x$) such that the voltage at the bit node is determined by the ratio of the resistance of transistor $T_x$ and the resistance a first pull up device (transistor $T_{pu}$). The source of the transistor $T_{pd}$ is coupled to the local ground reference which is at some voltage greater than the global ground reference because the strong (low resistance) transistor $T_{strong}$ is disabled, leaving only the weak (high resistance) transistor $T_{weak}$ enabled. The higher resistance (and higher voltage drop) path provides a higher voltage local ground reference as compared to the read operation The bit node is also the input to the second pull down device (transistor $T_{trip}$) which turns off when the voltage of the bit node is below voltage $V_{trip}$. In order to successfully write the logic 0, the voltage at the bit bar node must be pulled down below voltage $V_{trip}$. The higher local ground reference increases the voltage below which the bit node must be driven to turn off transistor $T_{trip}$. This improves the write margin of the device.

Thus, the design window is widened by relaxing the interdependence of the write margin parameters and the read stability margin parameters. This is accomplished without requiring the use of voltages above the standard power supply and/or below the ground voltage.

Figure 6:
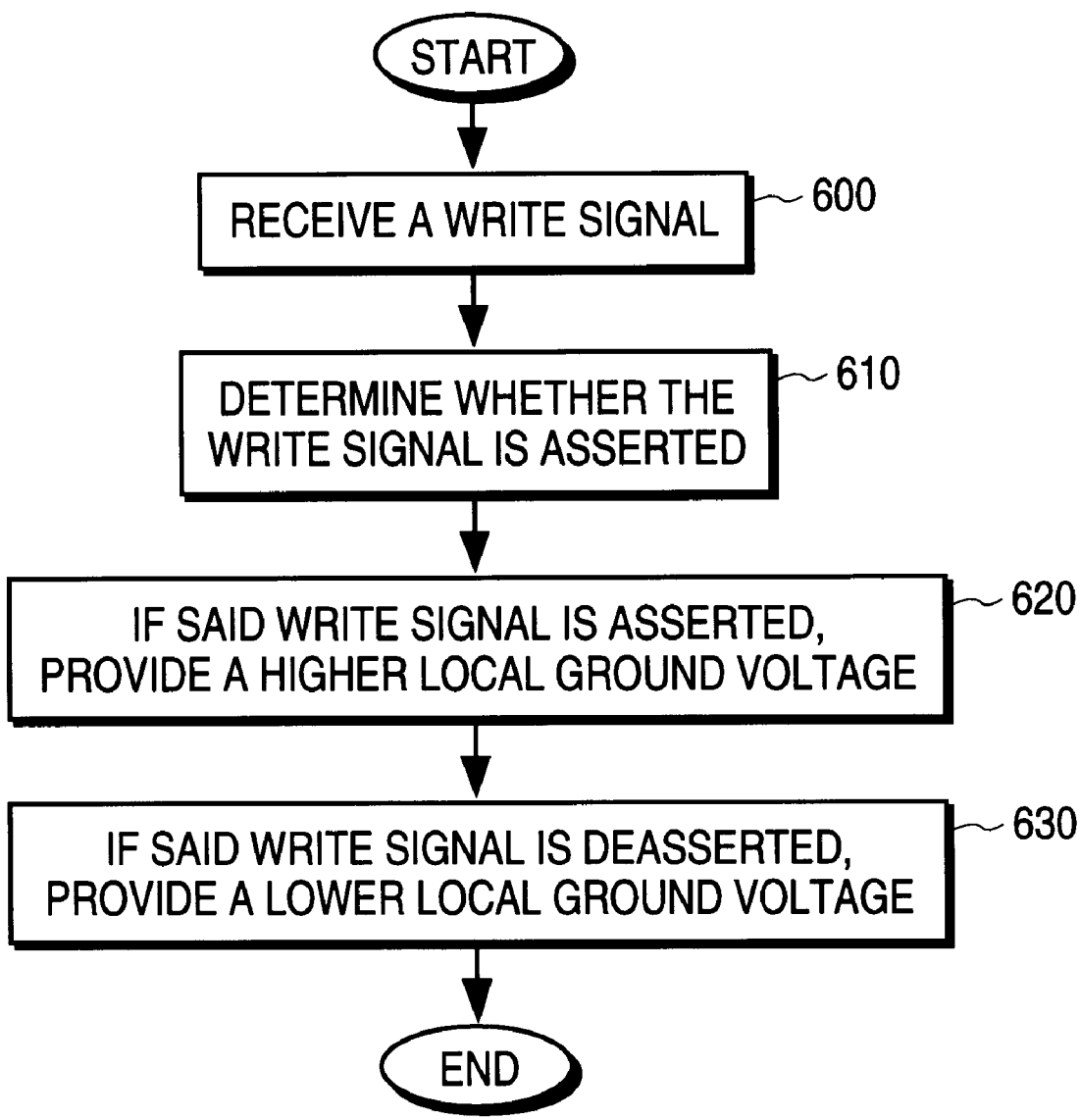
FIG. 6 illustrates one embodiment of a method of the present invention.

FIG. 6 illustrates one embodiment of a method of the present invention.

In step 600, a write signal is received.

In step 610, determining whether a write operation is being performed.

In step 620, providing a first local ground voltage if a write operation is being performed. By providing a higher first local ground reference, write margin is improved.

In step 630, providing a second local ground voltage if a write operation is not being performed. By providing a lower second local ground reference, read stability margin is improved.

Since the first local ground voltage may be independently selected from the second local ground reference, the design window may be enlarged.

What is claimed is:

1. An static random access memory (SRAM) comprising:
   an SRAM cell having a first node, said first node being a first ground reference; and
   a circuit configured to receive a first signal and coupled to drive said first node, said circuit further configured to drive said first node to a first voltage if said first signal is in a first state, said circuit configured such that said first node is at a second voltage if said first signal in a second state, said first signal configured to be in said first state to indicate a write operation and in said second state to indicate a non-write operation, said first voltage being greater than said second voltage.

2. The SRAM of claim 1 wherein said circuit comprises a transistor having a drain, a source, and a gate, said drain coupled to said first node, said source coupled to a second node, said gate coupled to receive said first signal, said second node being a second ground reference.

3. The SRAM of claim 2 wherein said circuit wherein said transistor has a first resistance when said first signal is in said first state and a second resistance when said first signal is in said second state, said first resistance being greater than said second resistance.

4. The SRAM of claim 2 wherein said first resistance approximates an open circuit.

5. The SRAM of claim 1 wherein said circuit comprises a variable resistance.

6. The SRAM of claim 5 wherein said variable resistance comprises a first transistor having a first drain and a first source, and a second transistor having a second drain and a second source, said first drain and said second drain being coupled to said first terminal, a first source and a second source being coupled to said second terminal.

7. The SRAM of claim 6 wherein said first transistor has a first gate coupled to receive said first signal.

8. The SRAM of claim 6 wherein said second transistor has a second gate coupled to receive said first signal.

9. The SRAM of claim 6 wherein said second transistor has a second gate coupled to a power supply.

10. An static random access memory (SRAM) comprising:
    an SRAM cell having a first node, said first node being a first ground reference; and
    a variable resistance having a first terminal coupled to said first node, a second terminal coupled to a second node, said second node being a global ground reference, said variable resistance being coupled to receive a first signal, said variable resistance being configured to have a first resistance if said first signal is in a first state and a second resistance if said second signal is in a second state, said first signal being configured to be in said first state to indicate a write operation and in said second state to indicate a non-write operation, said first resistance being greater than said second resistance.

11. A system comprising:
    a power supply;
    a processor configured to generate a first signal, said first signal having a first state and a second state, said first signal being configured to be in said first state to indicate a write operation and in said second state to indicate a non-write operation; and
    an SRAM coupled to said processor and said power supply, said SRAM comprises:
        an SRAM cell having a first node, said first node being a first ground reference; and
        a circuit coupled to receive a first signal and coupled to drive said first node, said circuit configured to drive said first node to a first voltage if said first signal is in said first state, said circuit configured such that said first node is at a second voltage if said first signal in said second state, said first voltage being greater than said second voltage.

12. The system of claim 11 wherein said circuit comprises a transistor having a drain, a source, and a gate, said drain coupled to said first node, said source coupled to a second node, said gate coupled to receive said first signal, said second node being a second ground reference.

13. The system of claim 12 wherein said circuit wherein said transistor has a first resistance when said first signal is in said first state and a second resistance when said first signal is in said second state, said first resistance being greater than said second resistance.

14. The system of claim 12 wherein said first resistance approximates an open circuit.

15. The system of claim 11 wherein said circuit comprises a variable resistance.

16. The system of claim 15 wherein said variable resistance comprises a first transistor having a first drain and a first source, and a second transistor having a second drain and a second source, said first drain and said second drain being coupled to said first terminal, said first source and said second source being coupled to said second terminal.

17. The system of claim 16 wherein said first transistor has a first gate coupled to receive said first signal.

18. The system of claim 16 wherein said second transistor has a second gate coupled to receive said first signal.

19. The system of claim 16 wherein said second transistor has a second gate coupled to a power supply.

20. A method of improving write margin in an SRAM having a node, said node being a ground reference, said method comprising the steps of:
    receiving a first signal, said first signal indicating a write operation;
    determining whether said first signal is in a first state, said first state indicating a write operation;
    if said first signal is in said first state, driving said node to a first voltage, said node being at a second voltage if said first signal is in a second state, said first voltage being greater than said second voltage.

21. The method of claim 20 further comprising the step of driving said node to said second voltage if said first signal is in said second state.

22. The method of claim 20 further comprising the step of floating said node if said first signal is in said second state.

23. The method of claim 20 further comprising the step of modifying the resistance of a variable resistance in response to said first signal.

* * * * *

UNITED STATES PATENT AND TRADEMARK OFFICE
CERTIFICATE OF CORRECTION

PATENT NO. : 5,898,610
DATED : April 27, 1999
INVENTOR(S) : Greason

It is certified that error appears in the above-identified patent and that said Letters Patent is hereby corrected as shown below:

Column 7,
Line 42, delete "comprises" and insert -- comprising --.

Signed and Sealed this

Twenty-fifth Day of November, 2003

JAMES E. ROGAN
*Director of the United States Patent and Trademark Office*